United States Patent
Iwafuji

(10) Patent No.: US 7,139,296 B2
(45) Date of Patent: Nov. 21, 2006

(54) SEMICONDUCTOR LASER CHIP UNIT AND SEMICONDUCTOR LASER MODULE USING THE SAME

(75) Inventor: Takami Iwafuji, Tokyo (JP)

(73) Assignee: NEC Corporation, Tokyo (JP)

( * ) Notice: Subject to any disclaimer, the term of this patent is extended or adjusted under 35 U.S.C. 154(b) by 289 days.

(21) Appl. No.: 10/714,895

(22) Filed: Nov. 18, 2003

(65) Prior Publication Data

US 2004/0101006 A1    May 27, 2004

(30) Foreign Application Priority Data

Nov. 26, 2002    (JP)    ............... 2002-341609

(51) Int. Cl.
*H01S 3/04*    (2006.01)
(52) U.S. Cl. .................... 372/36; 372/43.01
(58) Field of Classification Search ............... 372/36, 372/43.01, 97, 20, 107; 359/127, 122
See application file for complete search history.

(56) References Cited

U.S. PATENT DOCUMENTS

| | | | | |
|---|---|---|---|---|
| 5,113,404 A | * | 5/1992 | Gaebe et al. | ................. 372/36 |
| 5,264,392 A | * | 11/1993 | Gaebe et al. | ................. 438/27 |
| 5,561,684 A | * | 10/1996 | Martin | ................. 372/107 |
| 6,207,950 B1 | * | 3/2001 | Verdiell | ................. 250/239 |
| 2004/0037334 A1 | * | 2/2004 | Funada et al. | ................. 372/43 |

FOREIGN PATENT DOCUMENTS

| | | |
|---|---|---|
| JP | 5-110201 | 4/1993 |
| JP | 8-201660 | 8/1996 |
| JP | 2000-58975 | 2/2000 |
| JP | 2000-164970 | 6/2000 |
| JP | 2001-313613 | 11/2001 |

* cited by examiner

*Primary Examiner*—Minsun Oh Harvey
*Assistant Examiner*—Tuan N. Nguyen
(74) *Attorney, Agent, or Firm*—Young & Thompson

(57) ABSTRACT

A semiconductor laser chip unit includes an electrode pattern and a ground electrode; a semiconductor laser chip which is die-bonded to the ground electrode and outputs a laser beam according to a high-frequency signal transmitted from the electrode pattern and the ground electrode, and a collimator lens for collimating the laser beam from the semiconductor laser chip. The semiconductor laser chip and the collimator lens are so positioned that the laser beam output from the semiconductor laser chip is made incident on a surface of the collimator lens at a position inside of the focal point of the collimator lens, and the unit is integrated in a non-conductive heat sink so as to form a unit.

17 Claims, 7 Drawing Sheets

SEMICONDUCTOR LASER CHIP UNIT AND SEMICONDUCTOR LASER MODULE USING THE SAME

BACKGROUND OF THE INVENTION

1. Field of the Invention

The present invention relates to a semiconductor laser chip unit for use in optical fiber communications, and a semiconductor laser module using the semiconductor laser chip unit.

2. Description of the Related Art

As the use of the Internet has been explosively widespread, demand for expanding transmission capacity is strongly increased in recent years. Thus, not only an optical transmission using the wavelength of a single semiconductor laser diode, but also it is important to realize wavelength multiplex communications in which a plurality of semiconductor laser diodes are used and a plurality of wavelengths are multiplexed with high density. In the case of the multiplex communications, since a semiconductor laser diode has such a characteristic that the oscillation wavelength thereof fluctuates depending on temperatures (eg., 0.1 nm/° C.), a technique to keep the temperature of the semiconductor laser diodes constant is known. However, only keeping the temperature of the semiconductor laser diode constant cannot suppress with time of the semiconductor laser diode.

In the Japanese Patent Application Laid-open No. 2001-313613, for example, there is disclosed a technique to continuously detect the wavelength of a semiconductor laser diode and to feedback-control the temperature of the semiconductor laser diode so as to keep the wavelength constant. FIG. 1 is a diagram showing a conventional semiconductor laser module disclosed in the Japanese Patent Application Laid-open No. 2001-313613. Explanations will be given below with reference to the Figure.

In FIG. 1, a light source 111 for use in the semiconductor laser unit is an integrated light source in which a semiconductor laser chip 101 of the distributed feedback type and an optical modulator 102 of the electric field absorption type are monolithically integrated. A front optical output from the integrated light source 111 is optically coupled on an optical fiber 115 through a front collimator lens 112, an optical isolator 113 which blocks a reflected return light from an optical module on the transmission path, and a convergent lens 114.

A back optical output from the integrated light source 111, on the other hand, is made incident on a high reflection film 104 coated on the light receiving surface of a photodiode 103 through a back collimator lens 117. By setting the reflection rate of the high reflection film 104 to be about 50 to 80%, a portion of the back optical output from the integrated light source 111 is made incident on the photodiode 103 and the remaining portion is made reflected onto a wavelength filter 118. This photodiode 103 serves as an optical output monitor 116.

The laser beam reflected at the high reflection film 104 of the optical output monitor 116 is made incident on a non-reflective film 105 coated on the light receiving surface of a photodiode 106 through a wavelength filter 118, the transmission loss of which has a wavelength dependency. This photodiode 106 serves as a wavelength monitor 119.

In this semiconductor laser unit, respective optical elements, including the integrated light source 111, the front collimator lens 112, the back collimator lens 117, the optical output monitor 116, the wavelength filter 118 and the wavelength monitor 119, are mounted on a stem 122 on which a temperature detection element 120 is mounted, which stem is disposed on a thermionic cooling element 121. Therefore, respective optical elements are kept at the stable temperature and are fixed in a mechanically stable manner within a hermetic sealing package 123 by soldering or YAG laser welding.

In this way, the back optical output from the integrated light source 111 is branched. One of the branched output is detected at the photodiode 103, and the other is passed through the wavelength filter 118 so as to be detected at the photodiode 106. Based on signals from the photodiode 106 reflecting the transmission characteristic of the wavelength filter 118, the oscillation wavelength of the semiconductor laser diode is controlled by feedback-controlling the temperature of the integrated light source 111 with a use of the temperature detection element 120 and the thermionic cooling element 121.

However, in the technique disclosed in the Japanese Patent Application Laid-open No. 2001-313613, it is required that, in the state of the final product that an optical unit is hermetically sealed by the hermetic sealing package 123, the high-frequency characteristic of the semiconductor laser chip 101 be measured by inputting a high-frequency signal with a use of a pin (not shown) of the hermetic sealing package 123. If the semiconductor laser chip 101 is determined as defective in this measurement stage, the hermetic sealing package 123 and each optical unit must be disposed, or the unit must be replaced spending many work man-hours.

In another Japanese Patent Application Laid-open No. 2001-164970, there is disclosed a structure in which a semiconductor laser and a coplanar line are provided on a substrate which is mounted on a career. With this structure, the high-frequency characteristic of a semiconductor laser diode can be measured on the way of the assembling step of the semiconductor laser module, that is, before mounted on the career. However, since it has a structure that the back optical output from the semiconductor laser chip is directly received at a photodiode, a precise optical axis adjustment is required between the semiconductor laser chip and the photodiode.

SUMMARY OF THE INVENTION

It is therefore an object of the present invention to provide a semiconductor laser chip unit which is capable of reducing cost damages even when a semiconductor laser chip is defective or the like and is capable of achieving a wavelength control with high precision, and to provide a semiconductor laser module using the semiconductor laser chip unit.

A semiconductor laser chip unit of the present invention comprises: an electrode pattern and a ground electrode; a semiconductor laser chip which is die-bonded to the ground electrode and output a laser beam based on a high-frequency signal transmitted from the electrode pattern and the ground electrode; and a collimator lens for collimating the laser beam from the semiconductor laser chip. The semiconductor laser chip and the collimator lens are so positioned that the laser beam output from the semiconductor laser chip is made incident on a surface of the collimator lens at a position inside of the focal point of the collimator lens, and each element is integrated in a non-conductive heat sink so as to form a unit.

When a semiconductor laser chip is conducted by contacting a probe needle and the like on the electrode pattern, there arises a time lag until the semiconductor laser chip emits light. By using this time lag, it is possible to inspect characteristics of the high frequency signal input from the electrode pattern. When a laser beam is output from the semiconductor laser chip, the output laser beam is made incident on a lens surface of the collimator lens inside of the focal point of the collimator lens. Then, by passing through the collimator lens, the laser beam is collimated. The laser beam from the semiconductor laser chip is collimated so that the irradiation range is expanded. In the present invention, even though a plurality of optical detectors are arranged in parallel within the collimated irradiation range, each optical detector can receive the laser beam with the necessary volume of light. Therefore, it is possible to inspect, by using a plurality of optical detectors, whether the semiconductor laser chip is defective, whether positioning of the semiconductor laser chip and the collimator lens is drifted or the like, before the semiconductor laser chip is mounted in the package. It is also possible to control wavelength with high precision, since an output having a necessary volume of light for the inspection and a wide irradiation range is obtained in the state of unit. Further, the collimated light is obtained by mounting the collimator lens and the semiconductor laser chip on the heat sink, so that it can be obtained as one with more stable characteristic due to the heat dissipation effect of the heat sink. Moreover, since the ground electrode is formed on the heat sink, it is possible to increase the volume of the heat dissipation from the heat sink by expanding the formation area of the ground electrode. Further, the electrode pattern, the ground electrode, the semiconductor laser chip, and the collimator lens are integrated into the non-conductive heat sink so as to be a unit. Since these are the minimum required elements, it is possible to suppress the cost of loss to the minimum required one even when a nonconformity occurs.

Further, in the present invention, the semiconductor laser chip may be fixed with a support of a groove or a hole at such a position that the laser beam from the semiconductor laser chip is made incident on a surface of the collimator lens at a position inside of a focal point of the collimator lens. In this case, it is desirable that the positioning relationship between the collimator lens and the semiconductor laser chip have high precision. However, it can be adjusted by providing optical detectors or the like, which are mounted later when the semiconductor laser module is to be finished after formed as a unit. Therefore, it is possible to simplify the mounting structure of the semiconductor laser chip, the collimator lens and the like, and it does not badly affect the heat dissipating effect of the heat sink. Further, since the structure for supporting the collimator lens is such a simple structure as a groove or a hole, the processing precision can be easily improved, and the mounting precision, more specifically, the mounting precision of the collimator lens with reference to the semiconductor laser chip, can be improved. Further, since the semiconductor laser chip is mounted by die-bonding, the position with reference to the collimator lens can be easily controlled, and the mounting precision can be kept high.

It is desirable that the groove be formed along a travelling direction of the laser beam. With this groove, it is possible to induce the collimator lens to a position adjacent to the semiconductor laser chip, and also to easily mount the collimator lens. Further, by forming the groove, the dissipating area of the heat sink can be substantially expanded, and by forming the ground electrode in the groove, the volume of the heat dissipation of the heat sink can be increased.

It is desirable that the hole be formed on the way of a travelling direction of the laser beam. Since the object to be processed is a hole, it can be processed with high precision, and it is possible to secure the mounting position of the semiconductor laser chip and the collimator lens with high precision. The collimator lens may be a spherical lens or a non-spherical lens. Since the collimator lens may be a spherical lens or a non-spherical lens, the most appropriate type of lens can be selected based on the irradiation area which should be expanded. Further, it is desirable that the heat sink have less leakage loss of high frequency and be formed of a material with higher heat conductivity comparing with a Si material. Thus, the semiconductor laser chip can be driven by the most appropriate high-frequency signal to thereby output a laser beam based on the designed value. Further, since the heat sink is formed of a material having higher heat conductivity than a Si material, the heat generated with the driving of the semiconductor laser chip can be surely dissipated through the heat sink, so that the temperature control of the semiconductor laser chip can be effectively performed.

Further, a step may be formed on a portion of the heat sink where the collimator lens is fixed so as to expand the exposed lens surface of the collimator lens. With this structure, the irradiation area expanded by the collimator lens can be secured within the range of the board thickness of the heat sink, and the semiconductor laser chip unit can be compact by lowering the height of the mounting as much as possible.

It is desirable that the heat sink be formed of aluminum nitride, and a bonding part of the semiconductor laser chip be formed of indium phosphorus. Thus, the thermal expansion coefficients of the semiconductor laser chip and the heat sink are close so that the heat stress can be suppressed as much as possible. Further, since the heat sink is formed of aluminum nitride, the leakage loss of high frequency can be less than a case of a Si substrate. Therefore, the ability of the semiconductor laser chip can be exhibited as much as possible.

Further, the semiconductor laser chip outputs a front light and a back light from a front end surface and a back end surface, respectively, and the back light may be used as the laser beam. By using the front light and the back light output from the semiconductor laser chip, one light can be used for controlling the semiconductor laser chip, and the other can be used as a light for communications to thereby perform multiple communications.

It is desirable that the electrode pattern and the ground electrode be formed as a coplanar line. As such, by using the coplanar line as a high-frequency transmission line to the semiconductor laser chip, the semiconductor laser chip unit can be compact by utilizing the characteristics of the coplanar line.

It is desirable that the ground electrodes be formed on opposing end surfaces of the heat sink, respectively, and be connected through a via hole formed in the heat sink. As such, the heat sink can be die-bonded by using one ground electrode of the heat sink, and it is also possible to have the most appropriate structure as a high-frequency transmission path.

It is desirable that the heat sink include a resistance as an end of the high-frequency signal transmitted through the electrodes, and a condenser for protecting the semiconductor laser chip from a surge current of a bias current. As a resistance, a thin film resistor or a thick film resistor may be formed on the heat sink by using the deposition technique. As such, by using the end resistance or the condenser, a failure will not occur even when the heat sink is used as a high-frequency transmission path.

The aforementioned has been explained such a case that the present invention is configured as a semiconductor laser chip unit. However, the present invention may be configured as a semiconductor laser chip module by using the semiconductor laser chip unit. A semiconductor laser chip module according to the present invention comprises: the semiconductor laser chip unit, a wavelength detection means for detecting a wavelength of the laser beam passing through the collimator lens, and a temperature control means for controlling the temperature of the semiconductor laser chip, all of which are incorporated in one package.

As described above, the semiconductor laser chip unit can be performed a necessary inspection in itself alone. Further, a semiconductor laser chip module can be configured only with a semiconductor laser chip unit which has been passed the inspection. Therefore, the fraction defective of the semiconductor laser chip module can be greatly reduced.

It is desirable that a driver IC for modulating the semiconductor laser chip be incorporated in the package. A high-frequency signal is output from a driver IC and input into a semiconductor laser chip in the same package. Therefore, the transmission path of the high-frequency signal to the semiconductor laser chip can be greatly reduced comparing with a case of disposing the driver IC outside of the package. With this structure, a fine high-frequency signal can be transmitted to the semiconductor laser chip.

It is desirable that the wavelength detection means comprise an optical detector for receiving a laser beam passing through a wavelength filter, and another optical detector for directly receiving a laser beam from the collimator lens, and branch the laser beam emitted for respective optical detectors by a beam splitter.

In the case of detecting the laser beams in the different optical detectors by using the wavelength filter, each optical detector comes close to each other if a beam splitter is not used. Therefore, a light reflected on the side face of the wavelength filter may become a stray light, which is to be made incident on the optical detector. In the present invention, this does not occur since the laser beam is branched by the beam splitter.

It is desirable that the optical detector be a photodiode. By using such a semiconductor product, it is possible to improve compactness and durability.

It is desirable that the wavelength filter be an etalon filter. With the etalon filter, the permeation characteristic of the light is changed by not only a wavelength of the light but also an incident angle of the light. Therefore, by making the laser beam to be a parallel light and making the incident angle against the wavelength filter constant, the wavelength of the laser beam are accurately detected. Further, the etalon filter has a periodical permeation characteristic according to the wavelength, and is capable of shifting the permeation characteristic corresponding to an incident angle. Therefore, one type of etalon filter can work as a wavelength filter for different wavelengths of plural types.

BRIEF DESCRIPTION OF THE DRAWINGS

FIGS. 2A and 2B show a first embodiment of a semiconductor laser chip unit according to the present invention, in which FIG. 2A is an overall perspective view, and FIG. 2B is a longitudinal sectional view taken along the line I—I in FIG. 2A;

FIGS. 3A and 3B show a second embodiment of the semiconductor laser chip unit according to the present invention, in which FIG. 3A is an overall perspective view, and FIG. 3B is a longitudinal sectional view taken along the line II—II in FIG. 3A;

FIGS. 4A and 4B show a third embodiment of the semiconductor laser chip unit according to the present invention, in which FIG. 4A is an overall perspective view, and FIG. 4B is a longitudinal sectional view taken along the line III—III in FIG. 4A;

FIGS. 5A and 5B show a first embodiment of a semiconductor laser module according to the present invention, in which FIG. 5A is a plan view, and FIG. 5B is a longitudinal sectional view taken along the line IV—IV in FIG. 5A;

PREFERRED EMBODIMENTS OF THE PRESENT INVENTION

Figure 1:
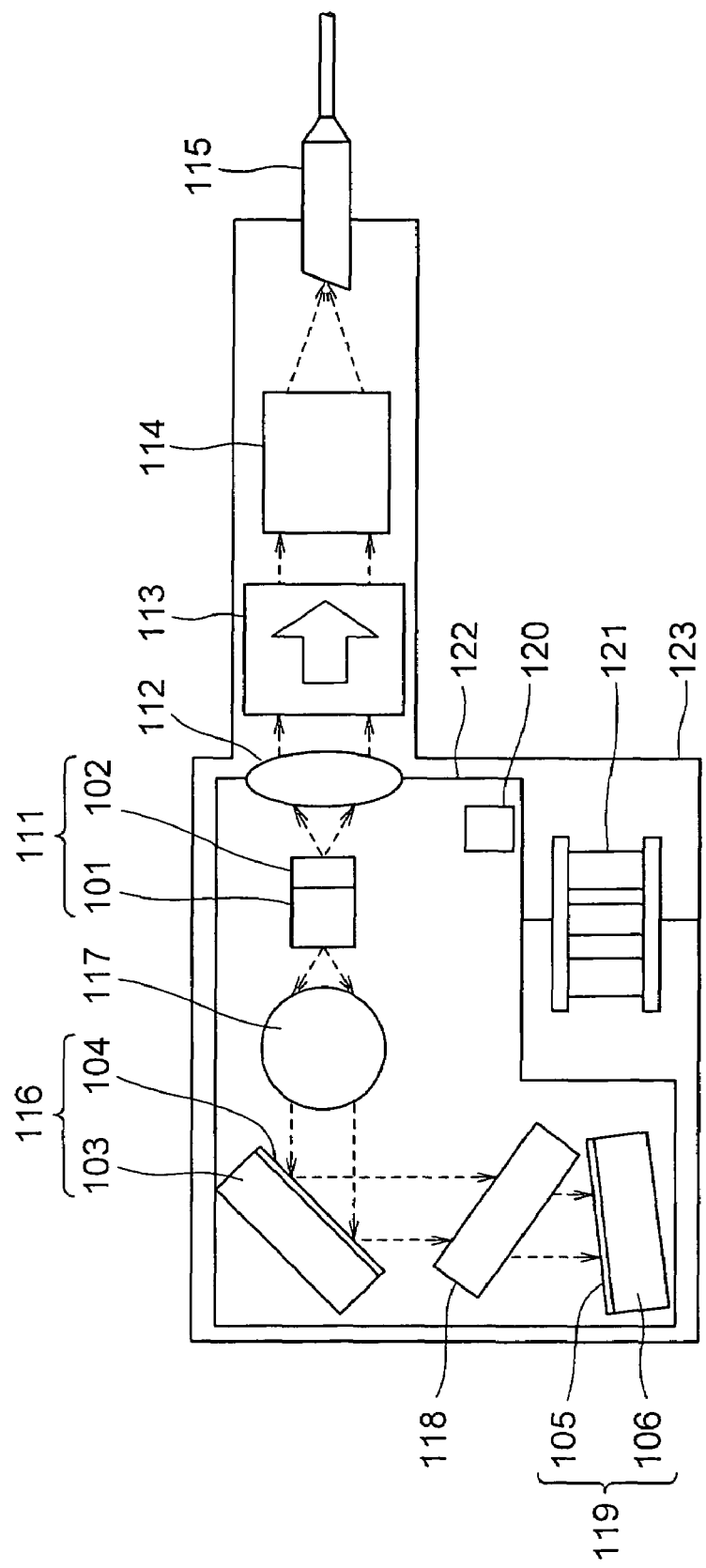
FIG. 1 is a diagram showing a conventional semiconductor laser module.
Figure 2A:
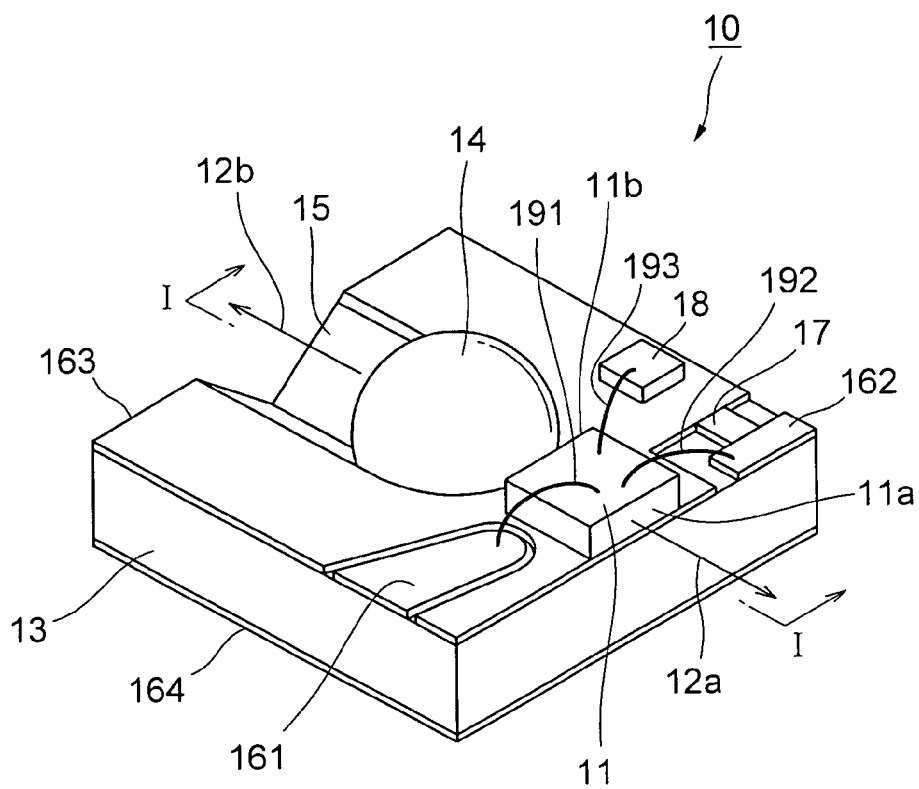
Figure 2B:
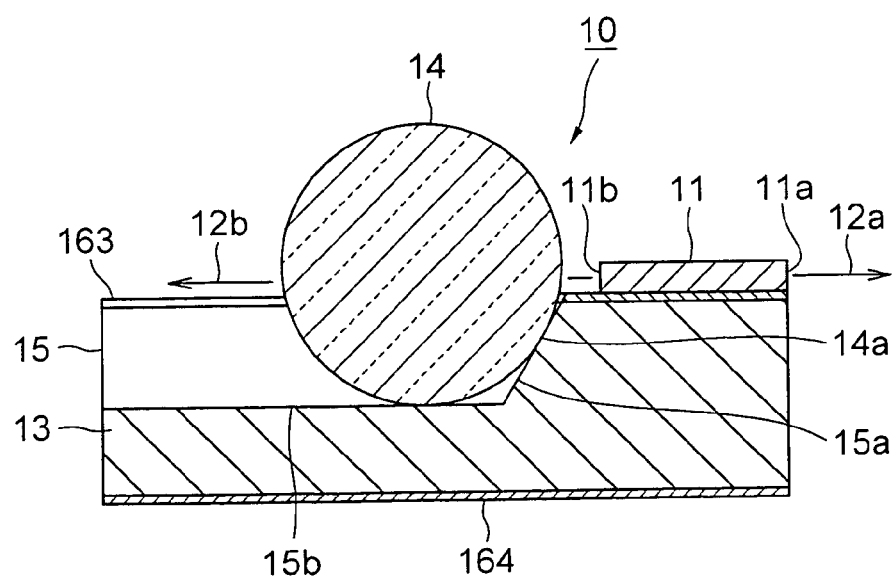

FIGS. 2A and 2B show a first embodiment of a semiconductor laser chip unit according to the present invention, in which FIG. 2A is an overall perspective view, and FIG. 2B is a longitudinal sectional view taken along the line I—I in FIG. 2A. Explanations will be given below with reference to these Figures.

A semiconductor laser chip unit 10 of the present embodiment forms a unit (subassembly) comprising: a semiconductor laser chip 11 which outputs a front light 12a and a back light 12b from a front end surface 11a and a back end surface 11b, respectively; a heat sink 13 on which the semiconductor laser chip 11 is die-bonded; a collimator lens 14 which is provided in the heat sink 13 so as to convert the back light 12b output from the semiconductor laser chip 11 into a collimated light; and electrode patterns 161, 162 which are formed on the heat sink 13 and are electrically connected to the semiconductor laser chip 11. In the embodiment described below, although a lens with a spherical surface, the surface of which is in the spherical shape, is exemplary used as the collimator lens 14, it is not limited to this ball lens 14. A lens with a non-spherical surface may be used instead of the lens with a spherical surface.

The heat sink 13 is provided with a V-groove 15 formed along a travelling direction of the back light 12b. The V-groove 15 has a V-shaped cross section. In the V-groove 15, the ball lens 14 is fixed at a position against the back end surface 11b of the semiconductor laser chip 11.

On the top surface of the heat sink 13, the electrode patterns 161, 162 and a ground electrode 163 are formed separately. The electrode patterns 161, 162 and the semiconductor laser chip 11 are electrically connected by bonding wires 191, 192, respectively, so that high-frequency signals are transmitted to the semiconductor laser chip through the electrode patterns 161, 162. Further, a thin film resistor 17 is connected between the electrode pattern 162 and the ground electrode 163. The thin film resistor is an end of a high-frequency signal. Although resistance of the resistor 17 is set as 50Ω in the embodiment, the resistance is not limited to this value provided that it is the end of the high-frequency signal. Further, one end of a chip condenser 18 is soldered onto the ground electrode 163, and the other end is electrically connected to the semiconductor laser chip 11 by a bonding wire 193. With this structure, the chip condenser 18 has a function of preventing the semiconductor laser chip 11 from breakage caused by a surge current of a bias current. It should be noted that the electrode patterns 161, 162 and the ground electrode 163 are, for example, gold plated films with about 1 µm to 4 µm, and the bonding wires 191 to 193 are, for example, gold wires.

The V-groove 15 is so formed that an inner wall on the side of the semiconductor laser chip 11 is formed as an inclined plane 15a with its left side downward. The ball lens 14 is so arranged in the V-groove 15 that a part 14a of the lower-half spherical face of the ball lens 14 contacts the inclined plane 15a so as to be positioned and mounted in the V-groove 15. Therefore, the ball lens 14 is fixed to the heat sink 13 with a stable position in such a manner that it is supported by the opposing V-shaped bottom 15b of the V-groove 15, and a part 14a of the lower-half spherical surface is supported by the inclined plane 15a. In order to fix the ball lens 14 to the heat sink 13, a UV adhesive, a low-melting glass, a solder or the like may be used. With this mounting structure, the semiconductor laser chip 11 and the collimator lens 14 are so positioned that the laser beam output from the semiconductor laser chip 11 is made incident on a surface of the collimator lens at a position inside of the focal point of the collimator lens 14, and the respective components are integrated into the non-conductive heat sink so as to form a unit.

A coplanar line in which the electrode patterns 161, 162 and the ground electrode 163 are arranged on the same plane as the heat sink 13 is used, and is designed to have the characteristic impedance of the coplanar line of 50Ω.

The semiconductor laser chip 11 is die-bonded on the ground electrode surface 163 on the heat sink 13 through a back electrode (not shown). Further, a ground electrode 164 is deposited across the back surface of the heat sink 13. The ground electrode 163 on the top surface of the heat sink 13 and the ground electrode 164 on the back surface are connected each other by a via hole (a through hole, not shown).

As a material of the heat sink 13, aluminum nitride is used. A first reason is, since the electric resistance of the aluminum nitride is $10^8$ higher than that of silicon, a leakage loss is low when the high-frequency signals propagate the electrode patterns 161, 162. A second reason is, since the thermal expansion coefficient of aluminum nitride is almost the same as that of indium phosphorus which is the material of the semiconductor laser chip 11, it is less prone to a stress caused by a distortion or the like when the temperature fluctuates.

A bias current to the semiconductor laser chip 11 is supplied through the chip condenser 18 and the bonding wire 193. A high-frequency signal to the semiconductor laser chip 11 is input through the electrode pattern 161 and the bonding wire 191 of the coplanar line.

In the present embodiment, the irradiation range of the laser beam from the semiconductor laser chip is expanded by the ball lens 14. Therefore, by arranging two or more optical detectors in parallel, and by irradiating a laser beam with enough volume of light to these optical detectors, a characteristic test of the semiconductor laser chip 11 and an inspection of a collimated light of the back light 12b can be performed before the semiconductor laser chip unit 11 is incorporated into a package, so that defective parts can be eliminated before incorporated into a package. Further, the semiconductor laser chip unit has such a structure that the semiconductor laser chip 11 is die-bonded to the ground electrode 163, and the electrode patterns 161, 162 and the ground electrode 163 for exchanging high-frequency signals with the semiconductor laser chip 11 are formed to have a coplanar line structure, a semiconductor laser chip module can be formed to be miniaturized.

Figure 3A:
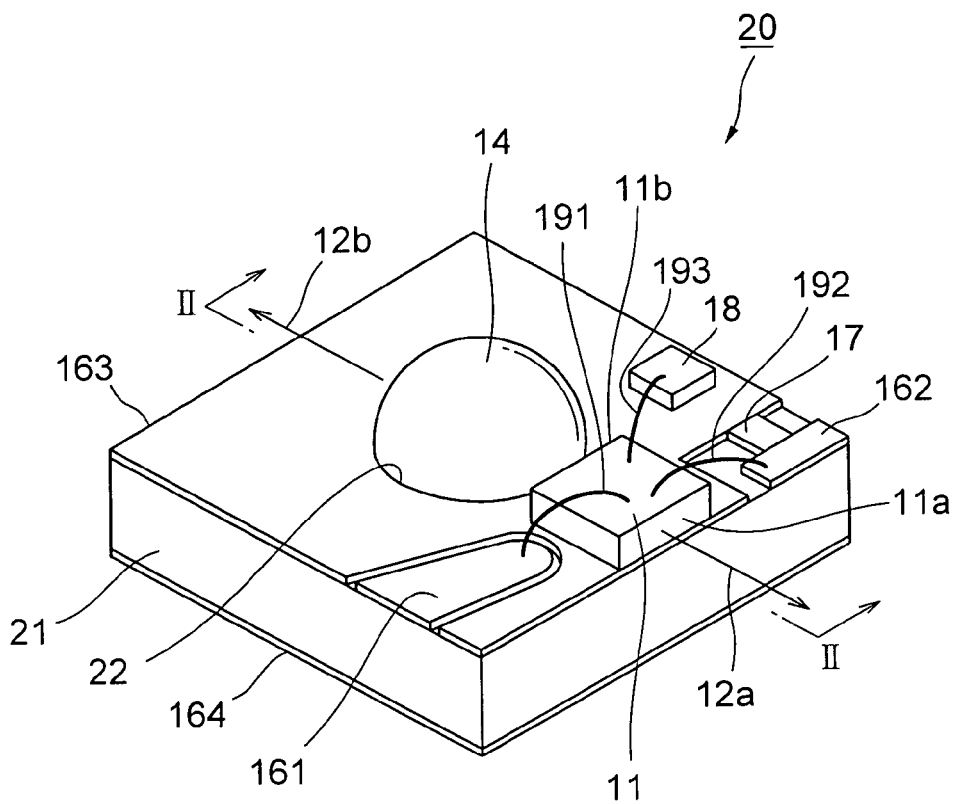
Figure 3B:
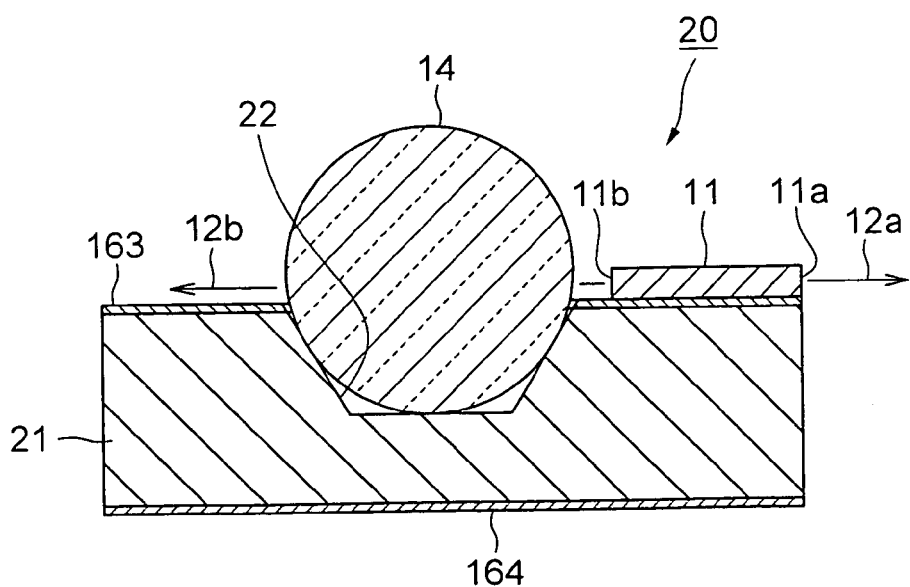

FIGS. 3A and 3B show a second embodiment of a semiconductor laser chip unit according to the present invention, in which FIG. 3A is an overall perspective view, and FIG. 3B is a longitudinal sectional view taken along the line II—II in FIG. 3A. Explanations will be given below with reference to these Figures. Same reference numerals are used to denote the same parts as FIGS. 2A and 2B so that their explanations are omitted.

In a semiconductor laser chip unit 20 of the present embodiment, a truncated conical hole 22 is formed in a heat sink 21 on the way of a travelling direction of a back light 12b. The ball lens 14 is fixed in the hole 22.

In the first embodiment shown in FIGS. 2A and 2B, the V-groove 15 (FIGS. 2A and 2B) is formed by cutting out the heat sink 13 so as to mount the ball lens 14 in it. On the other hand, in the present embodiment, the ball lens 14 is mounted in the hole 22 processed to be truncated cone, instead of the V-groove. The truncated conical hole 22 needs less processing amount and is easier to be processed with high precision than the V-groove, so that the back light 12b is less scattered and the yield is improved.

In the present embodiment, since the ball lens 14 is held by the truncated conical hole 22, the entire periphery thereof is supported by the truncated conical hole 22 so that the ball lens 14 is supported in the stable condition. Further, since the movement of the entire periphery of the ball lens 14 is limited by the truncated conical hole 22, it can be easily positioned. It should be noted that the processing of the truncated conical hole 22 may be performed by end milling, another cutting operation (eg., blade saw), sand blasting or the like.

Figure 4A:
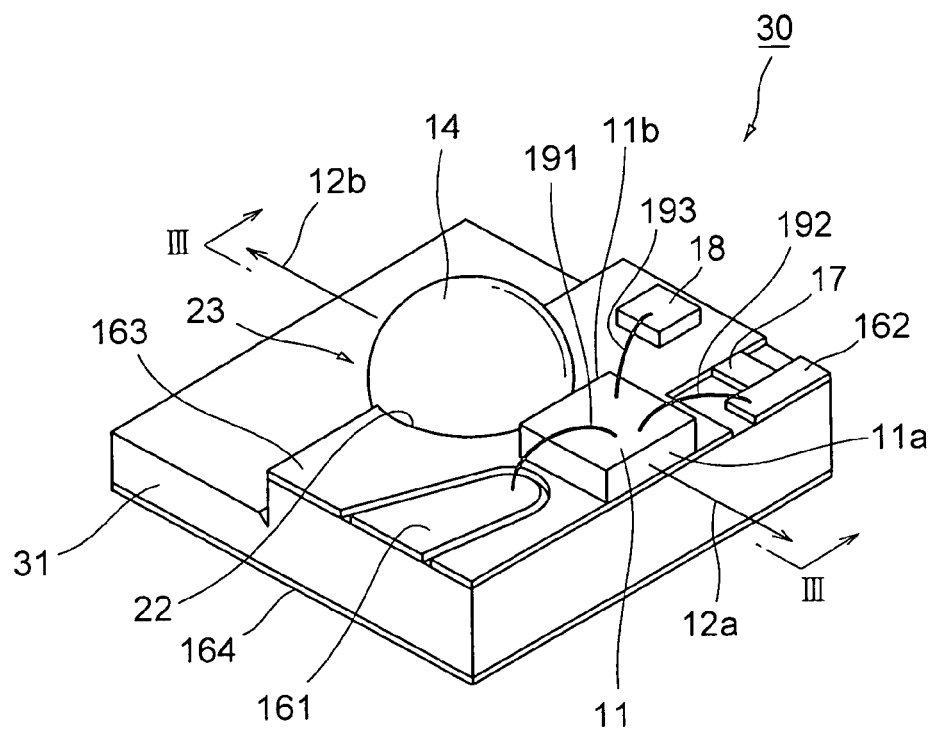
Figure 4B:
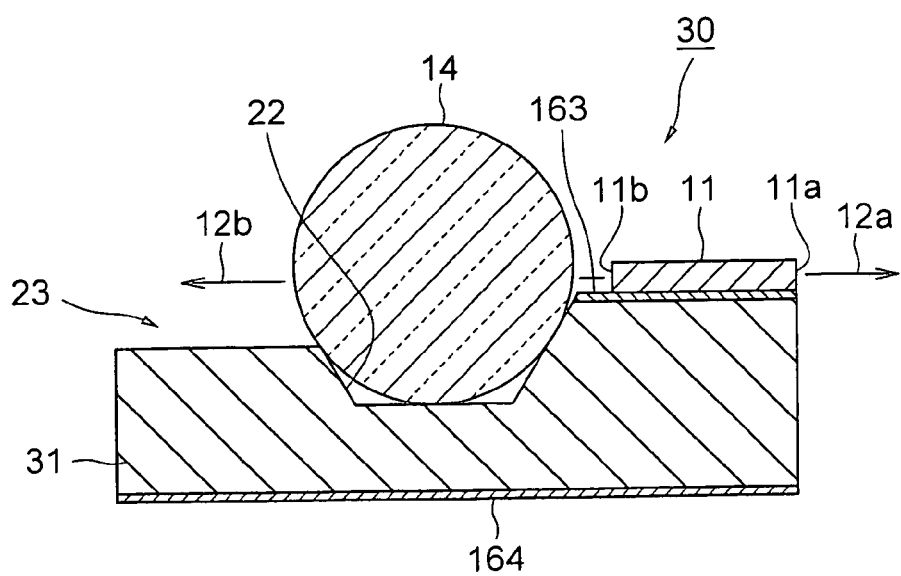

FIGS. 4A and 4B show a third embodiment of the semiconductor laser chip unit according to the present invention, in which FIG. 4A is an overall perspective view, and FIG. 4B is a longitudinal sectional view taken along the line of III—III in FIG. 4A. Explanations will be given below based on these Figures. Same reference numerals are used to denote the same parts as FIGS. 3A and 3B so that their explanations are omitted.

In the present embodiment, a step 23 is formed by chipping the plate thickness of the heat sink 31 behind the ball lens 14 so as to expose the lower half of the ball lens 14.

In the present embodiment, the exposed portion of the ball lens 104 is expanded by removing the plate thickness of about a half of the truncated conical hole 22. Therefore, it is possible to mount an optical detector or the like by using the step 23 of the heat sink 31, and also possible to limit the height of a semiconductor laser chip module to be low to thereby miniaturize the semiconductor laser chip module.

Figure 5A:
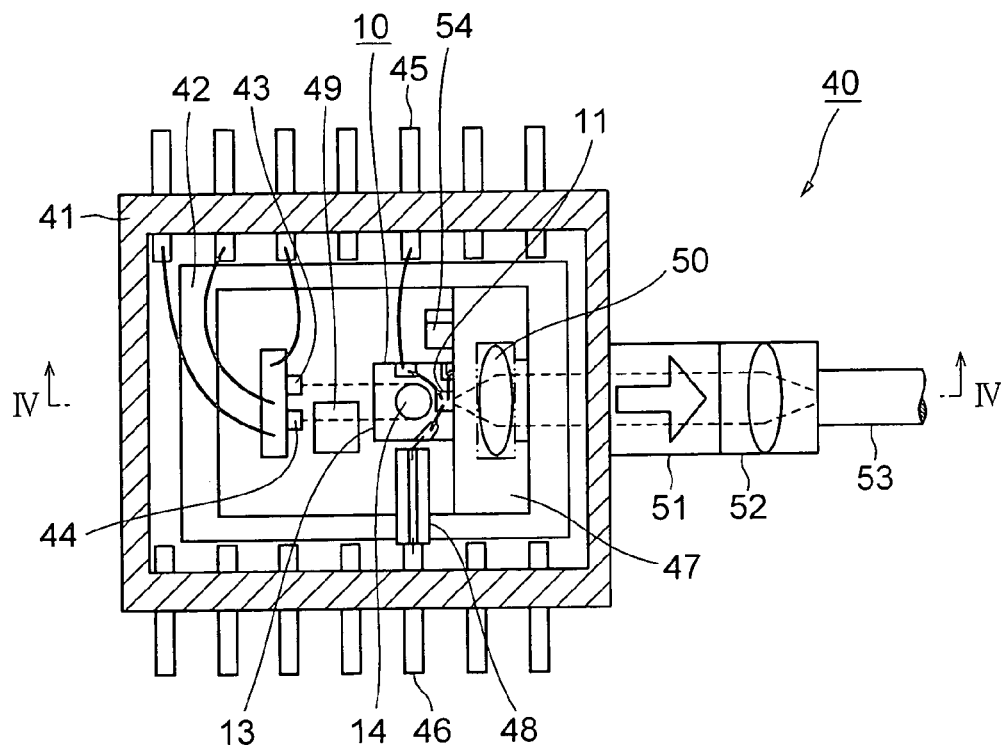
Figure 5B:
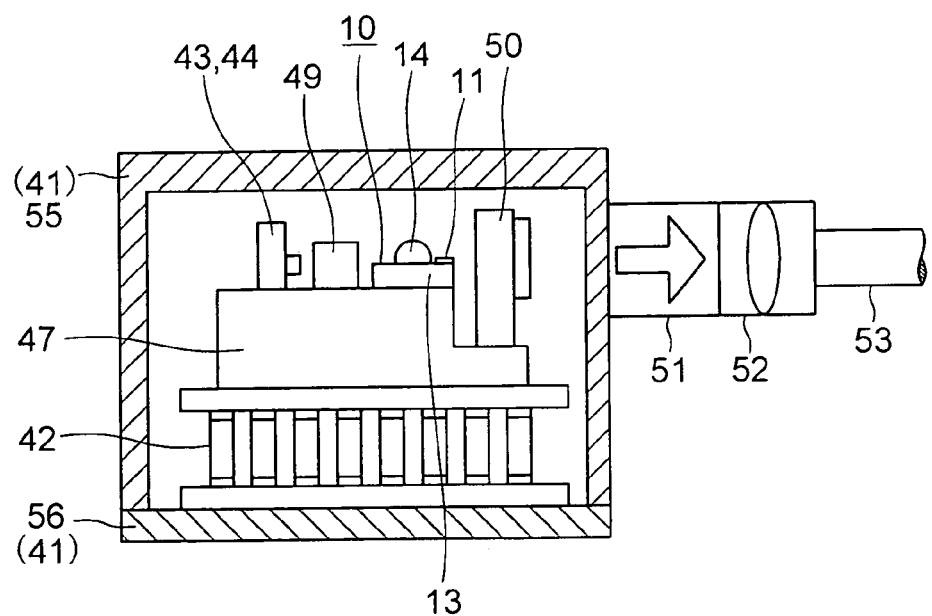
Figure 6:
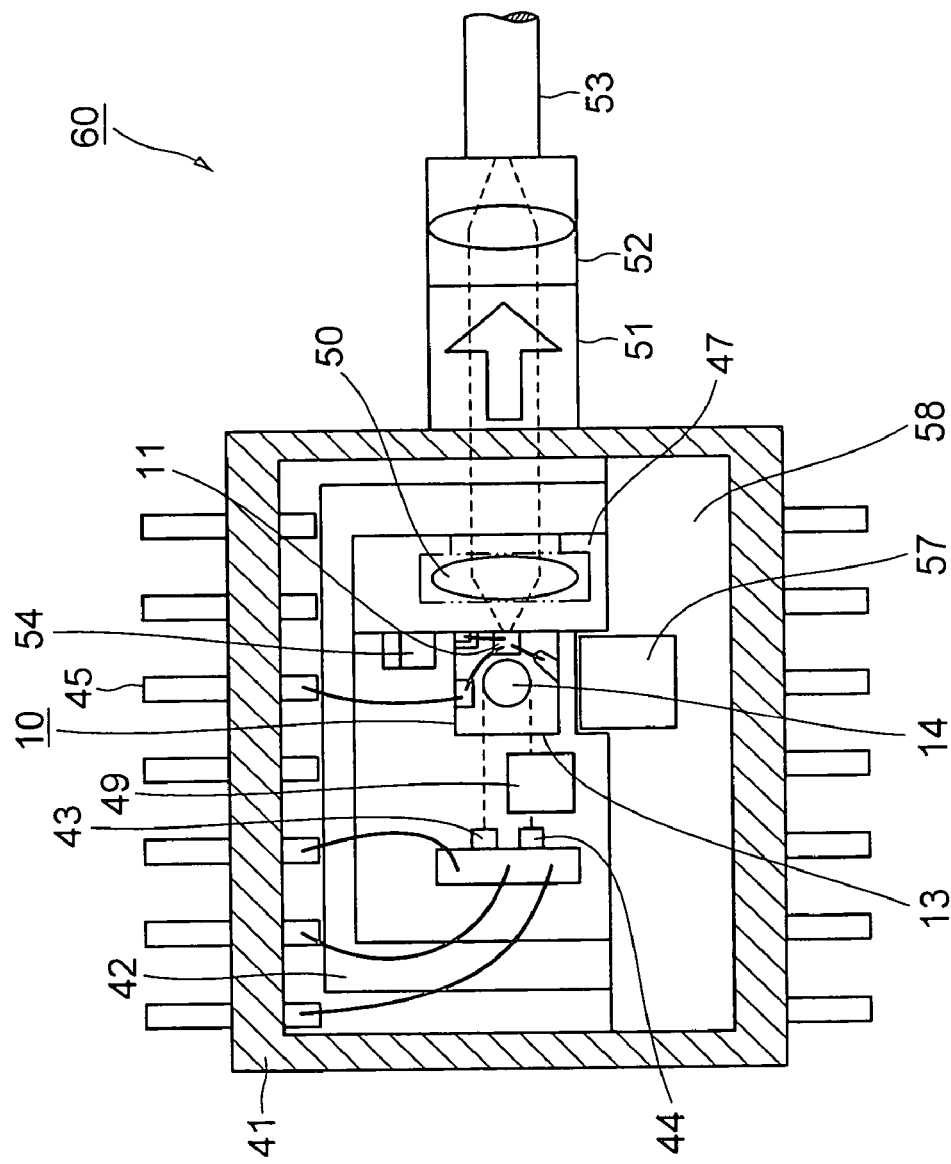
FIG. 6 is a plan view showing a second embodiment of the semiconductor laser module according to the present invention.

FIGS. 5A and 5B show a first embodiment of a semiconductor laser module accoding to the present invention, in which FIG. 5A is a plan view, and FIG. 5B is a longitudinal sectional view taken by cutting the package along the line IV—IV in FIG. 5A. Explanations will be given below based on FIGS. 2 and 5. Same reference numerals are used to denote same parts in FIGS. 5A and 5B as that in FIGS. 2A and 2B so that their explanations are omitted.

A semiconductor laser module 40 of the present embodiment uses the semiconductor laser chip unit 10 of FIGS. 2A and 2B, and has a function of converting a light oscillated from the semiconductor laser chip 11 and transmitting it by an optical fiber 53, as well as monitoring the wavelength using the back light 12b of the semiconductor laser chip 11.

A package 41 with a lead comprises a frame 55 formed of ceramic such as alumina, and a base 56 formed of CuW or the like. An electronic cooling element 42 for adjusting the temperature of the semiconductor laser chip 11 is soldered on the base 56, and a metal carrier 47 is soldered thereon. On the top surface of the carrier 47, there are mounted a temperature sensing element 54 for sensing the temperature of the semiconductor laser chip 11, a lens 50, a wavelength filter 49 for monitoring the wavelength of the semiconductor laser chip 11, optical detectors 43, 44 and the like. The heat sink 13 is formed of aluminum nitride having a high thermal conductivity in order to dissipate a heat released from the semiconductor laser chip 11 to the carrier 47 effectively.

The wavelength filter 49 may be an etalon filter. Since an etalon filter has a periodical permeation property corresponding to a wavelength and is capable of shifting the permeation property depending on incident angles, one type of etalon filter can work as a wavelength filter for various wavelengths of plural types. Therefore, it has a cost merit comparing with a bandpass filter which needs to be prepared in plural types for covering a broadband. It should be noted that since an etalon filter changes the permeation property depending on incident angles, it can be used by collimating the back light in such a manner that the incident angles are to be the same, as this structure.

Next, an operation of the semiconductor laser module 40 will be explained. The semiconductor laser chip 11 emits light by a bias current input from an input terminal pin 45. A signal from an input terminal pin 46 is input to the semiconductor laser chip 11 through a wiring board 48 for high-frequency signals. Further, a thin film resistor 17 is wired with a bonding wire 192 so as to cause the thin film resistor 17 of 50Ω to be in parallel with the semiconductor laser chip 11, since the resistor is the end of the high-frequency signal. With this structure, a light emitted from the semiconductor laser chip becomes the one modulated by the high-frequency signal.

The modulated front light 12a is converted to be a collimated light by a lens 50, and after passing through an optical isolator 51, condensed by a lens 52 and made incident on the optical fiber 53. On the other hand, the back light 12b of the semiconductor laser chip 11 is converted into a collimated light through the ball lens 14, a part of which is directly detected by an optical detector 43, and the rest is made incident on an optical detector 44 through a wavelength filter 49 such as an etalon filter. By using an output current value of the optical detector 43, constant controlling of the optical output of the semiconductor laser chip 11 is performed. Further, based on an output current value of the optical detector 44, the temperature of the semiconductor laser chip 11 is controlled by the electronic cooling element 42 while monitored by the temperature sensing element 54, to thereby stabilize with high precision the wavelength oscillated by the semiconductor laser chip 11.

Figure 7:
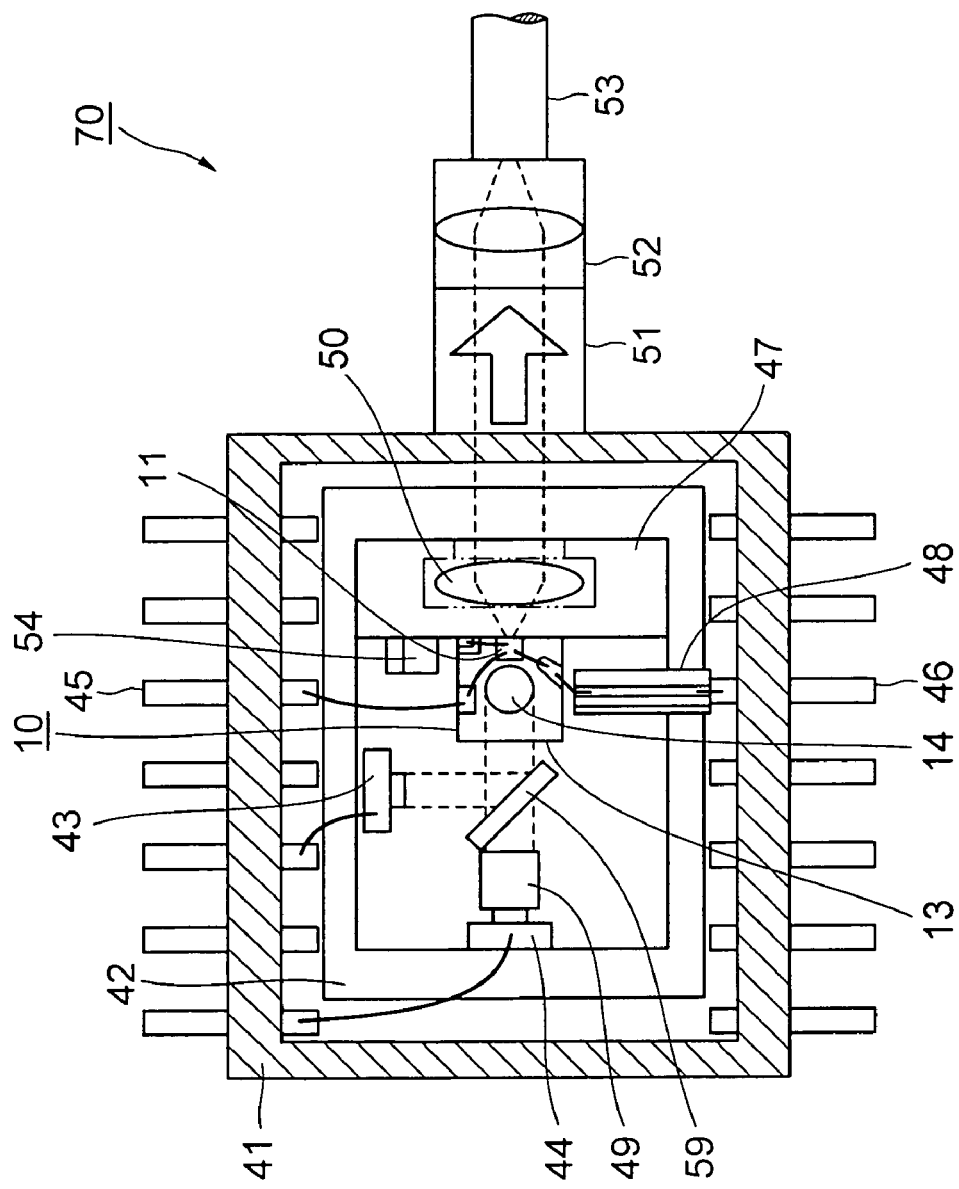
FIG. 7 is a plan view showing a third embodiment of the semiconductor laser module according to the present invention.

FIG. 7 is a plan view showing a second embodiment of the semiconductor laser module of the present invention. Explanations will be given below based on FIGS. 2A, 2B, 5A, 5B and 6. Same reference numerals are used to denote same parts in FIG. 7 as that in FIGS. 5A and 5B so that their explanations are omitted.

In the first embodiment shown in FIGS. 5A and 5B, a high-frequency signal to the semiconductor laser chip 11 is input from the input terminal pin 46, passes through the wiring board 48 via the bonding wire, and further passes through the electrode pattern 161 on the heat sink 13 and the bonding wire 191, to thereby reach the semiconductor laser chip 11.

In a semiconductor laser module 60 of the present embodiment, a terrace 58 formed of ceramic or the like is formed in a package 41 onto which a driver IC 57 for generating high-frequency signals is mounted. By mounting the driver IC 57 for modulating a semiconductor laser chip onto the terrace 58 in the close proximity of the semiconductor laser chip 11, a transmission path for high-frequency signals to the semiconductor laser chip 11 can be largely reduced so that the high-frequency signals are transmitted to the semiconductor laser chip 11 in good condition. That is, by mounting the driver IC 57 in the semiconductor laser module 60, the distance between the driver IC 57 and the semiconductor laser chip 11 can be shorten so that the high-frequency characteristic is improved.

FIG. 7 is a plan view showing a third embodiment of the semiconductor laser module according to the present invention. Explanations will be given below based on FIGS. 2A, 2B, 5A, 5B and 6. Same reference numerals are used to denote same parts in FIG. 7 as that in FIGS. 5A and 5B so that their explanations are omitted.

In the first embodiment in FIGS. 5A and 5B, the back light 12b of the semiconductor laser chip 11 is divided into a light passing through the wavelength filter 49 and a light not passing through the wavelength filter 49, each of which is detected by the different optical detector 44, 43.

In a semiconductor laser module 70 of the present embodiment, the back light 12b of the semiconductor laser chip 11 is branched by a beam splitter 59. One of the branched lights is directly made incident on the optical detector 43, and the other is made incident on the optical detector 44 through the wavelength filter 49. As such, influences of the edge portion of the wavelength filter 49 need not to be considered, so that assembling man-hour can be reduced. On the other hand, the first embodiment shown in FIGS. 5A and 5B has one piece less components than the present embodiment. Therefore, it has a merit of making the structure simple. Instead of the beam splitter 59, a half mirror may be used.

It should be noted that the present invention is of course not limited to the aforementioned embodiments. For example, the heat sink may be formed of another ceramic such as alumina, silicon or the like, instead of aluminum nitride. Further, not only for the back light but also for the front light, a groove or a hole may be formed on the top surface of the heat sink and a collimator lens may be mounted therein, so as to form it as a subunit.

(Effects)

According to the semiconductor laser chip unit of the present invention, the semiconductor laser chip, the heat sink onto which the semiconductor laser chip is die-bonded, the collimator lens which is fixed on the heat sink and converts the laser beam output from the semiconductor laser chip into a parallel light which is collimated, and the electrode pattern which is electrically connected to the semiconductor laser chip and fixed on the heat sink, are formed to be a unit. With this configuration, a high-frequency characteristic can be inspected by conducting the semiconductor laser chip unit, and also the parallel light can be obtained from the semiconductor laser chip. Therefore, it is possible to inspect whether a semiconductor laser chip is defective, or whether positions of a semiconductor laser chip and a collimator lens are drifted, before the semiconductor laser chip is incorporated into a package. In other words, since inspections can be performed in the state of a unit, defective components can be eliminated before being incorporated in a package or the like. Therefore, it is possible to reduce cost damages even when defective components are found. Further, it is possible to cause an output light to be a collimated light which is stable and easy to be inspected in the state of a unit. As such, since the light is processed into a form which is stable and easy to be inspected, wavelength controlling can be realized with high precision. Further, it is possible to obtain a collimated light with such a simple and stable structure that a collimator lens is fixed in a concavity formed in the heat sink. In addition to the aforementioned effects, unique effects are exhibited in the following cases, respectively.

If a groove or a hole is formed in the heat sink and a ball lens is fixed in the groove or the hole, positioning of the collimator lens can be easily performed.

If the groove is formed in the heat sink along a travelling direction of the laser beam and the ball lens is fixed in the groove, it is possible to prevent a back light passing through the ball lens from being interfered by the heat sink.

If the hole is formed in the heat sink on the way of a travelling direction of the laser beam and the ball lens is fixed in the hole, the ball lens can be fixed with high precision and manufacturing becomes easy.

If the hole is formed in the heat sink on the way of a travelling direction of the laser beam, the ball lens is fixed in the hole, and a space is provided to the heat sink along a travelling direction of the laser beam which has passed through the ball lens, it is possible to prevent the laser beam having passed through the ball lens from being interfered by the heat sink.

If the semiconductor laser chip is formed of indium phosphorus and the heat sink is formed of aluminum nitride, a leakage loss and a heat stress become small.

If the back light output from the semiconductor laser chip is converted into a parallel light by the collimator lens, the back light is accurately detected so that the semiconductor laser chip can be preferably used in a semiconductor laser module which feedback-controls the semiconductor laser chip.

The semiconductor laser module of the present invention uses the semiconductor laser chip unit according to the present invention so that it is possible to inspect whether the semiconductor laser chip is defective, or whether positions of the semiconductor laser chip and the collimator lens are drifted, before the semiconductor laser chip is incorporated into a package. Therefore, even when there is any defective semiconductor laser chip or the like, cost damages can be reduced. Further, since a collimated light can be obtained in the state of a sub unit and the light is processed to be in a form of stable and easy to be inspected, a wavelength control with high precision can be achieved. In addition to the aforementioned effects, further unique effects will be exhibited in the following case.

If a driver IC for converting the semiconductor laser chip is provided in the package, the transmission path for high-frequency signals to the semiconductor laser chip can be greatly reduced. Therefore, high-frequency signals can be transmitted to the semiconductor laser chip in good condition.

If the laser beam is branched using a beam splitter into one passing through the wavelength filter and one not passing through the wavelength filter, it is possible to prevent the reflected light from the edge of the wavelength filter from being incident on an optical detector as a stray light.

Since a collimated light can be obtained in the state of a sub unit, an etalon filter can be used as a wavelength filter.

In this case, one type of etalon filter works as a wavelength filter for various wavelengths of plural types.

What is claimed is:

1. A collimator lens collimating the beam from a semiconductor chip which is die-bonded to an electrode pattern and a ground pattern, wherein each of the electrode pattern, ground electrode, semiconductor laser and the collimator lens is integrated in a non-conductive heat sink that having less leakage loss of high frequency and higher heat conductivity than Si material.

2. The semiconductor laser chip unit, as claimed in claim 1, wherein the semiconductor laser chip is fixed with a support of a groove or a hole at such a position that the laser beam from the semiconductor laser chip is made incident on a surface of the collimator lens at approximately a focal point of the collimator lens.

3. The semiconductor laser chip unit, as claimed in claim 2, wherein the groove is formed along a travelling direction of the laser beam.

4. The semiconductor laser chip unit, as claimed in claim 2, wherein the hole is formed on a way of a travelling direction of the laser beam.

5. The semiconductor laser chip unit, as claimed in claim 1, wherein the collimator lens may be a spherical lens or a non-spherical lens.

6. The semiconductor laser chip unit, as claimed in claim 1, wherein an exposed lens surface of the collimator lens is expanded by forming a step on a portion of the heat sink where the collimator lens is fixed.

7. The semiconductor laser chip unit, as clamed in claim 1, wherein the heat sink is formed of aluminum nitride, and a bonding part of the semiconductor laser chip is formed of indium phosphorus.

8. The semiconductor laser chip unit, as claimed in claim 1, wherein the semiconductor laser chip outputs a front light and a back light from a front end surface and a back end surface, respectively, and uses the back light as the laser beam.

9. The semiconductor laser chip unit, as claimed in claim 1, wherein the electrode pattern and the ground electrode are formed as a coplanar line.

10. The semiconductor laser chip unit, as claimed in claim 1, wherein the ground electrodes are formed on opposing end surfaces of the heat sink respectively, and are connected through a via hole formed in the heat sink.

11. A collimator lens collimating the beam from a semiconductor chip which is die-bonded to an electrode pattern and a ground pattern, wherein each of the electrode pattern, ground electrode, semiconductor laser and the collimator lens is integrated in a non-conductive heat sink that includes a resistance as an end of the high-frequency signal transmitted through the electrode pattern and the ground electrode, and a condenser for protecting the laser from bias surge current.

12. A semiconductor laser chip module comprises a semiconductor laser chip unit with an electrode and ground pattern, having a wavelength detection means passing through a collimator lens, a temperature control means incorporated in a package, where the laser diode is die-bonded to the ground electrode, wherein the semiconductor chip/electrode pattern/ground electrode/and collimator lens is integrated in a nonconductive heat sink to form a unit.

13. The semiconductor laser module, as claimed in claim 12, wherein the semiconductor laser chip is fixed with a support of a groove or a hole at such a position that the laser beam from the semiconductor laser chip is made incident on a surface of the collimator lens at approximately a focal point of the collimator lens.

14. The semiconductor laser module, as claimed in claim 12, wherein a driver IC for modulating the semiconductor laser chip is incorporated in a package.

15. The semiconductor laser module, as claimed in claim 14, wherein the optical detector is a photodiode.

16. The semiconductor laser module, as claimed in claim 12, wherein the wavelength detection means comprises an optical detector for receiving a laser beam passing through a wavelength filter, and another optical detector for directly receiving a laser beam from the collimator lens, and branches the laser beams emitted for respective optical detectors by a beam splitter.

17. The semiconductor laser module, as claimed in claim 14, wherein the wavelength filter is an etalon filter.

* * * * *